(12) United States Patent
Jenne

(10) Patent No.: US 8,269,287 B2
(45) Date of Patent: Sep. 18, 2012

(54) FLOATING GATE MEMORY DEVICE WITH INCREASED COUPLING COEFFICIENT

(75) Inventor: Fredrick Jenne, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 230 days.

(21) Appl. No.: 12/154,584

(22) Filed: May 22, 2008

(65) Prior Publication Data

US 2008/0290386 A1 Nov. 27, 2008

Related U.S. Application Data

(60) Provisional application No. 60/931,701, filed on May 25, 2007.

(51) Int. Cl.
*H01L 21/02* (2006.01)

(52) U.S. Cl. .......... 257/387; 257/112; 257/E29.13; 257/E29.263; 438/197

(58) Field of Classification Search .......... 257/112, 257/213, 296, 340, 341, 350, 351, 386, 378, 257/398, 399, 400, 401, 408, 465, 545, 549, 257/550, E29.13, E29.263; 438/135, 142, 438/153, 163, 188, 197, 199
See application file for complete search history.

(56) References Cited

U.S. PATENT DOCUMENTS

| | | | |
|---|---|---|---|
| 4,904,613 A | 2/1990 | Coe et al. | |
| 5,923,969 A * | 7/1999 | Oyamatsu | 438/183 |
| 6,534,364 B1 | 3/2003 | Erdeljac et al. | |
| 6,979,861 B2 * | 12/2005 | Rodov et al. | 257/329 |
| 2002/0005561 A1 * | 1/2002 | Kobayashi et al. | 257/510 |
| 2003/0164525 A1 * | 9/2003 | Rotondaro et al. | 257/390 |
| 2006/0170035 A1 * | 8/2006 | Shiba et al. | 257/326 |
| 2007/0097743 A1 * | 5/2007 | Fang et al. | 365/185.05 |
| 2007/0159880 A1 * | 7/2007 | Eitan | 365/184 |
| 2009/0057784 A1 * | 3/2009 | Chen | 257/408 |

OTHER PUBLICATIONS

International Search Report, PCT/US08/06628 filed May 23, 2008, mailed Sep. 18, 2008.

* cited by examiner

*Primary Examiner* — Olik Chaudhuri
*Assistant Examiner* — Su Kim

(57) ABSTRACT

Methods and apparatus for increasing the coupling coefficient of a floating gate memory device includes an MOS capacitors with self-aligning gate structures that provide increased capacitance per unit area over conventional MOS capacitors.

19 Claims, 12 Drawing Sheets

FLOATING GATE MEMORY DEVICE WITH INCREASED COUPLING COEFFICIENT

This application claims the benefit of the filing date of U.S. Provisional Application No. 60/931,701, filed on May 25, 2007, which is incorporated herein by reference in its entirety.

TECHNICAL FIELD

The present invention relates to nonvolatile semiconductor memory and, in particular, to the improvement of coupling coefficients for the programming of floating gate memory devices.

BACKGROUND

Stored charge non-volatile memory devices such as floating gate flash memory devices, for example, use charge on a floating gate of an MOS transistor to program the logic state of the transistor. FIG. 1 illustrates, in a somewhat idealized form not drawn to scale, the cross-section of a floating gate transistor, using an NMOS structure as an example (an equivalent PMOS device can also be made). The floating gate transistor includes a P-type silicon substrate with n+ source and drain diffusions which define the length of a channel region. Immediately above the channel is an insulating layer of oxide, typically silicon dioxide. Immediately above this oxide layer is the conductive floating gate, typically made of polysilicon. Immediately above the floating gate is another later of oxide, and above that layer is the control gate, typically another polysilicon gate. A passivating oxide layer, typically silicon dioxide, protects the above-described layers from contaminants.

Programming voltages can be applied to the transistor between the control gate and the substrate or source and drain diffusions to add or remove charge from the floating gate by hot carrier injection (HCI) or by Fowler-Nordheim tunneling ("programming" is used generically, herein, to refer to both program and erase operations). One figure of merit for a floating gate transistor is its programming efficiency. Programming efficiency is the time required to transition between the programmed and erased states for a giving programming voltage.

After the programming voltage is removed, the charge is retained on the floating gate because the floating gate is electrically isolated by the insulating oxide that prevents the charge from leaking to the channel, the source, the drain or the control gate of the transistor. The presence of charge on the floating gate causes a shift in the threshold voltage of the transistor, which is the gate-to-source voltage that turns the transistor on and allows current to flow from drain to source under an applied drain-to-source voltage.

For the NMOS device illustrated in FIG. 1, a positive voltage from the control gate to the substrate causes electrons to migrate from the channel to the floating gate, which raises the threshold voltage of the device (conventionally known as the "programmed" state). A negative voltage from the control gate to the substrate causes holes to migrate from the channel to the floating gate, which lowers the threshold voltage of the device (conventionally known as the "erased" state). The two different threshold voltages can be associated with different logic or data states (e.g., "1" and "0"). The voltage difference between the two thresholds, known as the sense window, is a measure of the integrity of the stored data.

A floating gate memory transistor can be read by applying a known gate-to-source voltage with a value between the programmed threshold voltage and the erased threshold voltage and sensing the current that flows through the memory transistor under an applied drain-to-source voltage. However, the read current can disturb the stored charge and cause leakage that reduces the sense window. If a large number of reads are performed without an intervening program or erase operation, the integrity of the stored data may be lost. In a floating gate device, such as that illustrated in FIG. 1, the floating gate is not directly accessible for measurement, so the only way to sense the state of the device is to sense the read current.

One approach to this problem has been to synthesize a floating gate memory device from two conventional, series-connected MOS transistors and to directly sense the voltage on the floating gate, where the voltage on the floating gate in the programmed and erased states is approximately equal to the threshold voltage shift associated with a conventional floating gate memory transistor. If the voltage is sensed with a high input impedance sense amplifier, then the stored charge is not disturbed. In this approach, one MOS transistor is configured as a capacitor (MOS capacitor) and the other transistor is configured as a tunnel diode (MOS tunnel diode). The programming efficiency of this configuration depends on a coupling coefficient between the MOS capacitor and the MOS tunnel diode. For efficient programming, the ratio of the capacitance of the MOS capacitor to the capacitance of the MOS tunnel diode should be a large as possible. However, conventional CMOS (complementary MOS) fabrication processes, using self-aligning gates, limits the capacitance per unit area of the MOS capacitor, requiring large areas of silicon to achieve the required capacitance.

BRIEF DESCRIPTION OF THE DRAWINGS

The present invention is illustrated by way of example and not limitation in the figures of the accompanying drawings, in which.

DETAILED DESCRIPTION

Methods and apparatus for increasing the coupling coefficient of a floating gate memory device are described. In the following description, numerous specific details are set forth such as examples of specific components, devices, methods, etc., in order to provide a thorough understanding of embodiments of the present invention. It will be apparent, however, to one skilled in the art that these specific details need not be employed to practice embodiments of the present invention. In other instances, well-known materials or methods have not been described in detail in order to avoid unnecessarily obscuring embodiments of the present invention.

In one embodiment of the present invention, a floating-gate memory device includes a self-aligning gate structure disposed upon a semiconductor substrate, where the self-aligning gate structure includes a plurality of gate fingers, where each gate finger includes an insulating layer disposed upon the semiconductor substrate and a conductive layer disposed upon the insulating layer, and where each gate finger is separated from an adjacent gate finger by a conductive diffusion region in the semiconductor substrate. The device further includes ion-implanted tips extending each diffusion region under adjacent gate fingers, such that a pair of ion-implanted tips under each gate finger forms a continuous conductive region under each gate finger.

Figure 1:
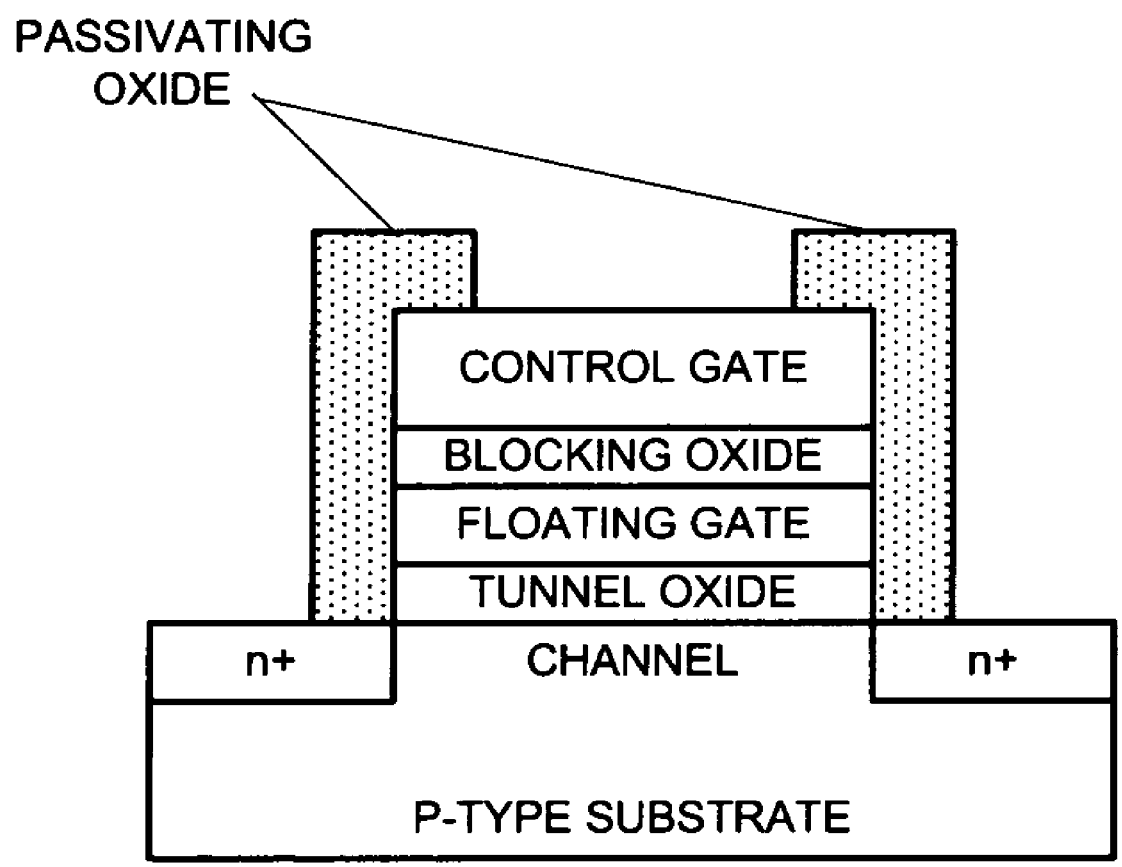
FIG. 1 illustrates a conventional floating gate memory device.
Figure 2A:
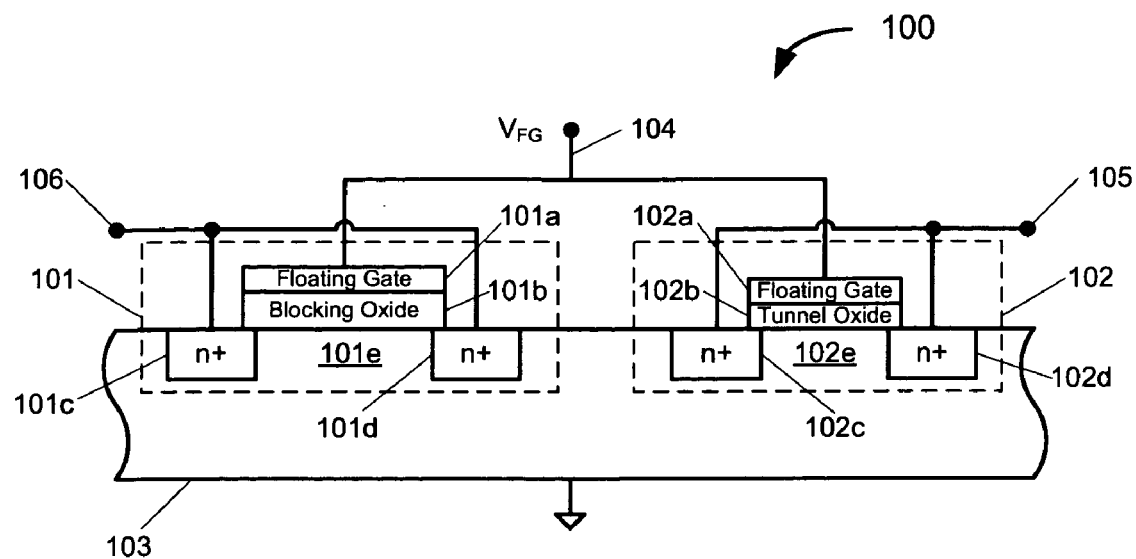
FIG. 2A illustrates a floating gate memory device synthesized from two MOS transistors.

FIG. 2A illustrates a floating gate memory device 100 synthesized from a series connection of two conventional MOS transistors 101 and 102 are fabricated on a common substrate 103. Transistors 101 and 102 are illustrated as NMOS transistors having a P-type substrate and N+ source and drain diffusions. Transistors 101 and 102 may also be fabricated as PMOS devices or as a complementary pair of devices (i.e., CMOS devices) as is known in the art. Transistor 101 includes a gate 101a, an insulating oxide layer 101b and source and drain diffusions 101c and 101d defining a channel region 101e. Transistor 102 includes a gate 102a, an insulating oxide layer 102b and source and drain diffusions 102c and 102d defining a channel region 102e. As illustrated in FIG. 2A, gates 101a and 102a are connected together to form a distributed floating gate with an accessible common node 104 where a floating gate voltage $V_{FG}$ can be measured. The source and drain 101c and 101d of transistor 101 are connected to form one programming node 106 and the source and drain 102c and 102d of transistor 102 are connected to form another programming node 105. The series connection of transistor 102 and transistor 101 results in the three terminal device 100 with an input terminal 105, an output terminal 106 and the aforementioned floating gate terminal 104.

Transistor 102 can be fabricated with gate 102a dimensions and oxide layer 102b thickness, such that transistor 102 functions as a tunnel diode when gate and source diffusions 102c and 102d are connected together as illustrated in FIG. 2A. Tunnel diode configurations of MOS transistors are known in the art and, therefore, are not described in further detail. Transistor 101 can be fabricated with gate 101a dimensions and oxide layer 101b thickness, such that transistor 101 functions as a capacitor when gate and source diffusions 101c and 101d are connected together as illustrated in FIG. 2A. As described in greater detail below, the capacitance of a conventional MOS transistor configured as a capacitor is determined primarily by the overlap capacitance between the source and drain diffusions 101c and 101d and the floating gate 101a.

Figure 2B:
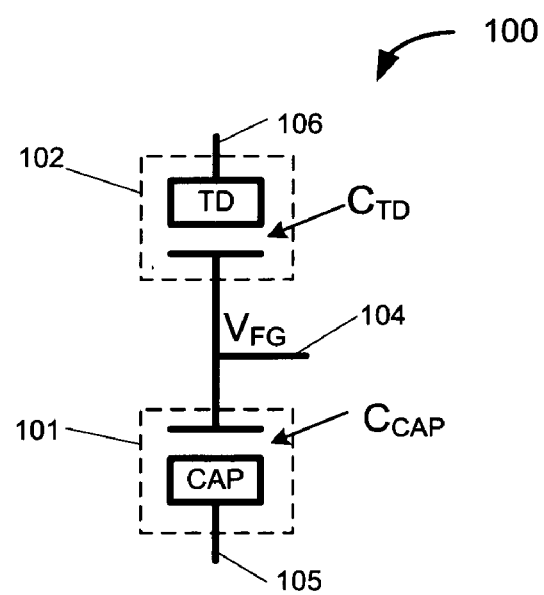
FIG. 2B is a schematic representation of the floating gate memory device illustrated in FIG. 2A.

FIG. 2B illustrates floating gate memory device 100 schematically. The tunnel diode 102 (TD) provides the tunneling or hot carrier injection of holes and/or electrons to the floating gate during programming and erasing operations. The tunnel diode has an equivalent capacitance $C_{TD}$, which is determined by the geometry of its gate 102a, channel 102e and diffusion regions 102c and 102d, as well as the thickness and dielectric constant of the intervening oxide 102b. The capacitor 101 (CAP) in series with the tunnel diode has an equivalent capacitance $C_{CAP}$, which is determined by the geometry of its gate 101a, channel 101e and diffusion regions 101c and 101d, as well as the thickness and dielectric constant of the intervening oxide 101b. As noted above, for efficient (i.e., fast) programming and erasing, $C_{CAP}$ should be much larger than $C_{TD}$.

Figure 3B:
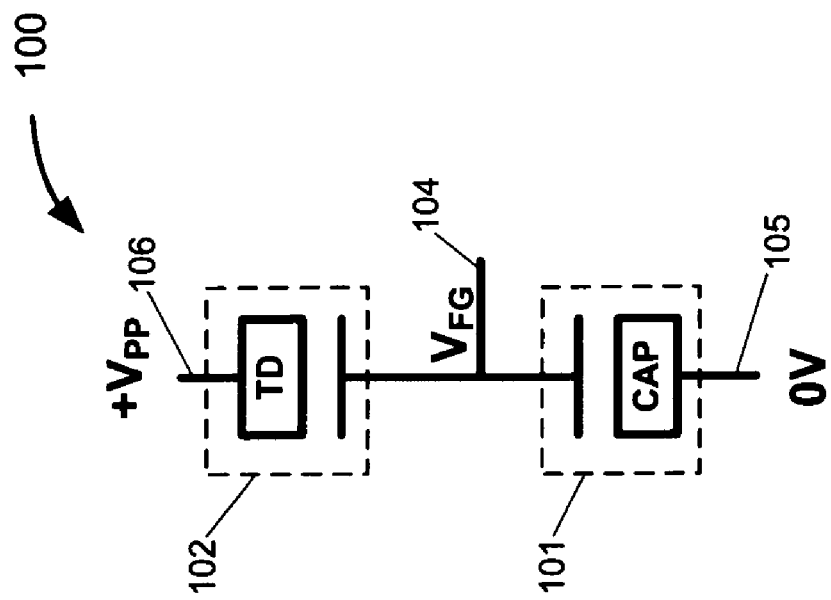
FIG. 3B illustrates programming the floating gate memory device of FIG. 2B.
Figure 3A:
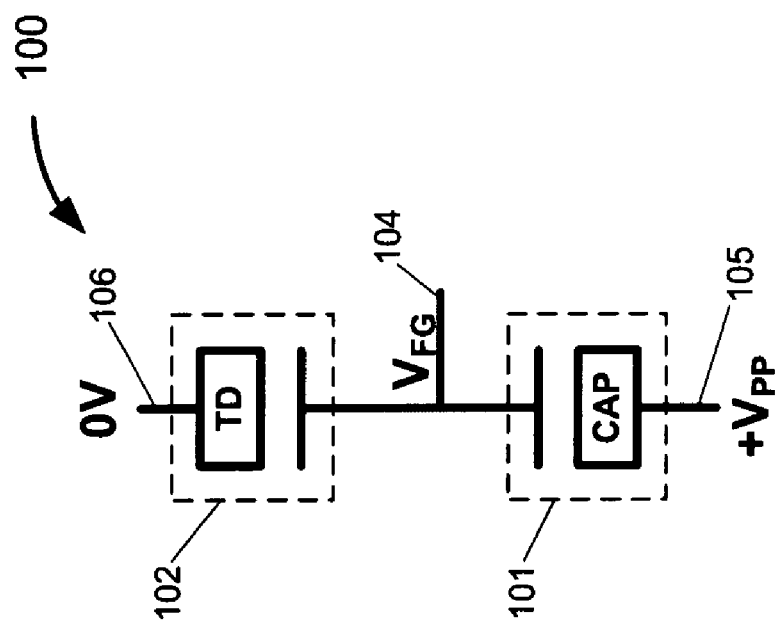
FIG. 3A illustrates erasing the floating gate memory device of FIG. 2B.

FIG. 3A illustrates how the floating gate memory device 100 is erased. A programming voltage pulse $V_{PP}$ is applied to the capacitor and the tunnel diode is grounded. The capacitances $C_{CAP}$ and $C_{TD}$ form a capacitive voltage divider such that the voltage on the floating gate is given by:

$$V_{FG} = V_{PP} \frac{C_{CAP}}{(C_{TD} + C_{CAP})}$$

The coupling coefficient k is the ratio of $V_{FG}$ to $V_{PP}$. That is:

$$k = \frac{V_{FG}}{V_{PP}} = \frac{C_{CAP}}{(C_{TD} + C_{CAP})}$$

If the voltage across the tunnel diode ($V_{FG}$) is high enough, electrons will tunnel through the diode and charge the floating gate. The rate of charge accumulation is determined by the magnitude of the floating gate voltage and the duration of the programming pulse determines how much total charge is transferred to the floating gate. The negative charge has the effect of lowering $V_{FG}$ or, equivalently, lowering the threshold voltage of device 100. Then, when the programming voltage $V_{PP}$ is removed, the accumulated negative charge is retained on the floating gate, which will have a negative potential approximately equal to the magnitude of the threshold voltage change due to the tunneling.

Programming is accomplished by reversing the applied polarity of $V_{PP}$ as illustrated in FIG. 2B. In this case, the magnitude of the voltage across the tunnel diode capacitance $C_{TD}$ is the same as before, except the polarity is reversed, and the reversed polarity causes electrons to tunnel off of the floating gate (or equivalently, holes to tunnel to the floating gate). The depletion of electrons (or the addition of holes) due to tunneling raises the value of $V_{FG}$ or, equivalently, the threshold voltage of the memory device 100. Then, when the programming voltage $V_{PP}$ is removed, the floating gate will have a positive potential approximately equal to the magnitude of the threshold voltage increase due to tunneling.

The magnitude of the residual floating gate voltage is a function of the duration of the programming or erase voltage pulses. For rapid programming at a given $V_{PP}$, the coupling coefficient k should be as high as possible to make $V_{FG}$ as high as possible. As $V_{FG}$ increases, the rate of tunneling or charge injection increases, and the device can be programmed and erased faster. The coupling coefficient can be increased by increasing the ratio of $C_{CAP}$ to $C_{TD}$. For example, if $V_{PP}$=10 volts and $C_{CAP}/C_{TD}$=6, then k=6/7=0.86 and $$V_{FG} = 10\frac{6}{(1+6)} = 8.6 \text{ volts}$$

However, if $C_{CAP}/C_{TD}$=10, then k=10/11=0.92 and $$V_{FG} = 10\frac{10}{(1+10)} = 9.2 \text{ volts}$$

Figure 4:
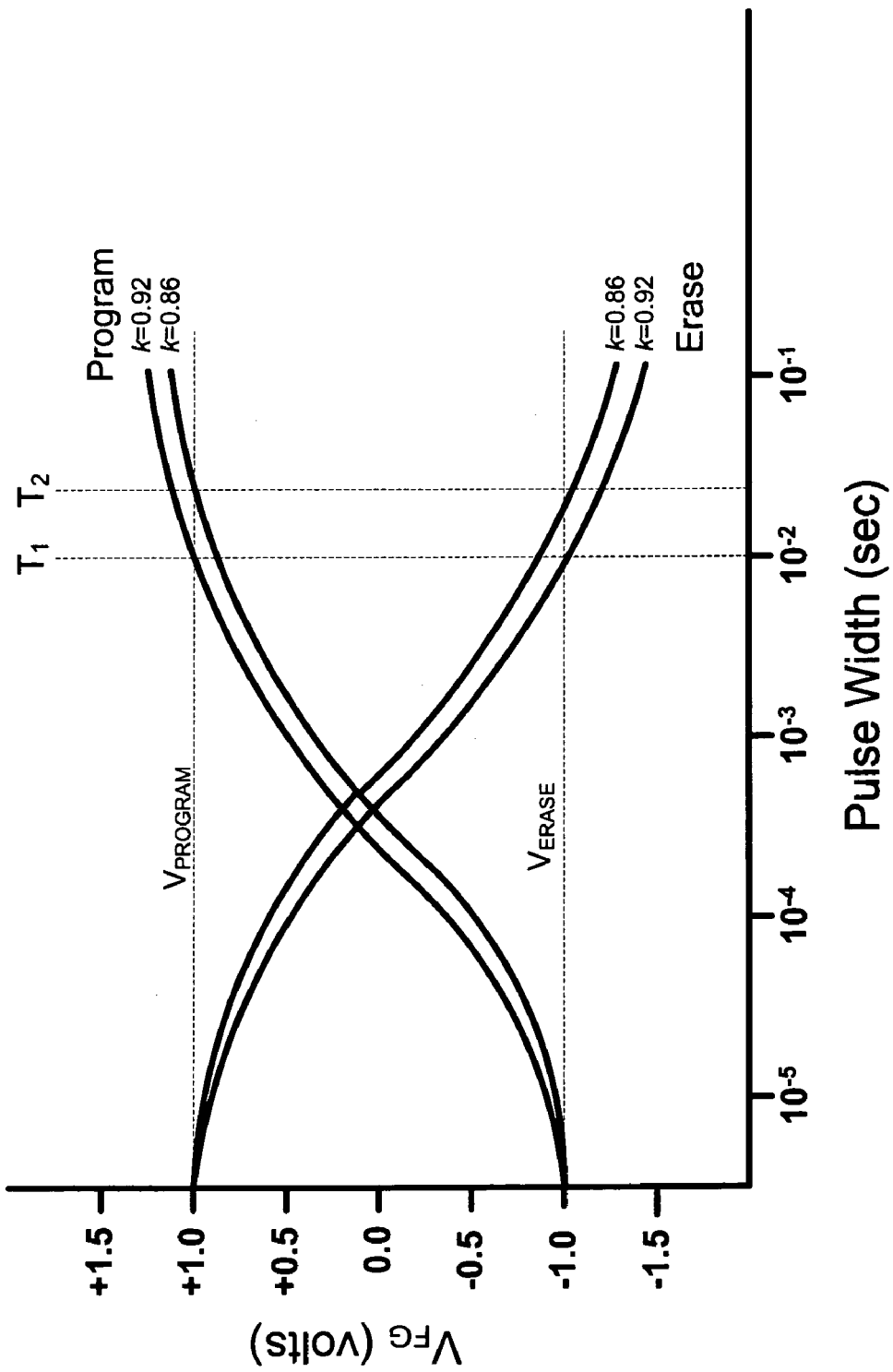
FIG. 4 illustrates programming and erase threshold voltage profiles of a floating gate memory device.

FIG. 4 illustrates the effect of the coupling coefficient on programming and erase speeds. As illustrated in FIG. 3, with a coupling coefficient of 0.86, a pulse of duration T2 is required to reach a specified program or erase voltage. However, if the coupling coefficient is raised to 0.92, then the target voltage can be reached with a shorter pulse duration of T1.

Figure 5A:
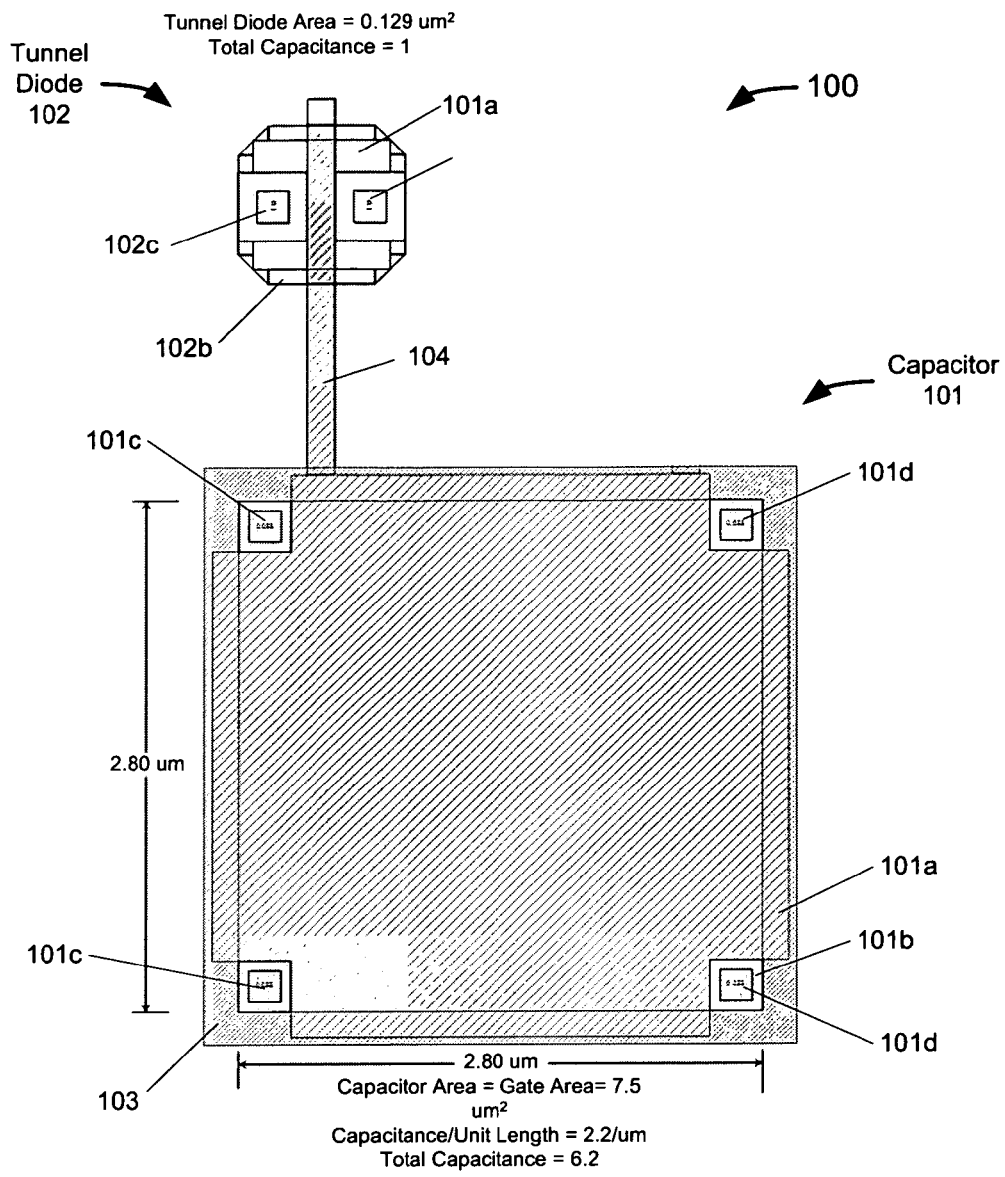
FIG. 5A illustrates a top view of the physical layout of a conventional floating gate memory device.
Figure 5B:
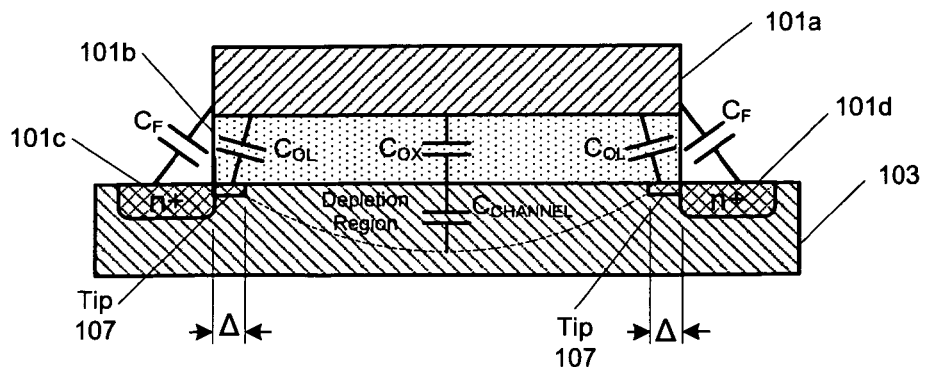
FIG. 5B illustrates a cross-sectional view of the floating gate memory device of FIG. 5A.

FIG. 5A illustrates a top view of a physical layout of floating gate memory device 100, where MOS capacitor 101 is fabricated with multiple source and drain diffusions 101c and 101d. FIG. 5B illustrates a cross-sectional view of MOS capacitor 101 (not to scale). In a self-aligning gate process, as is known in the art, the gate structure (i.e., oxide 101b and gate 101a) is defined before the source and drain diffusions 101c and 101d are made. The gate establishes a boundary for the diffusions and the gate is automatically aligned between the source and drain. The source and drain diffusions are essentially vertical, with very little horizontal diffusion under the gate. In some processes, directional ion implantation of donor impurities (for an NMOS device) is used to extend "tips" 107 under the gate with a length Δ as illustrated in FIG. 5B. The overlap of the tips 107 with the gate 101a is associated with an overlap capacitance $C_{OL}$ at each side of MOS capacitor 101. There is also a small fringing capacitance $C_F$ between the gate 101a and source diffusion 101c and between the gate 101a and the drain diffusion 101d. The majority of the capacitance of MOS capacitor 101 is provided by the series combination of the oxide capacitance $C_{OX}$ and the channel capacitance $C_{CHANNEL}$. The capacitance per unit gate length in this region of the transistor is much less than the overlap capacitance per unit length because the channel is not as heavily doped as the n+ source and drain regions and, under some circumstances, the channel region will be depleted of carriers to reflect the charge on the floating gate. The low capacitance per unit length limits the total capacitance for a given area of MOS capacitor 101. For the structure illustrated in FIG. 5A, the total physical area of the capacitor is approximately 7.5 square microns, the total capacitance is approximately 6.2 in normalized capacitance units and the capacitance per unit length is approximately 2.2 per micron. If the tunnel diode 102 has a capacitance of 1 normalized capacitance unit, then the coupling coefficient for the floating gate memory device illustrated in FIG. 5A is approximately 6.2/7.2=0.86.

Figure 6A:
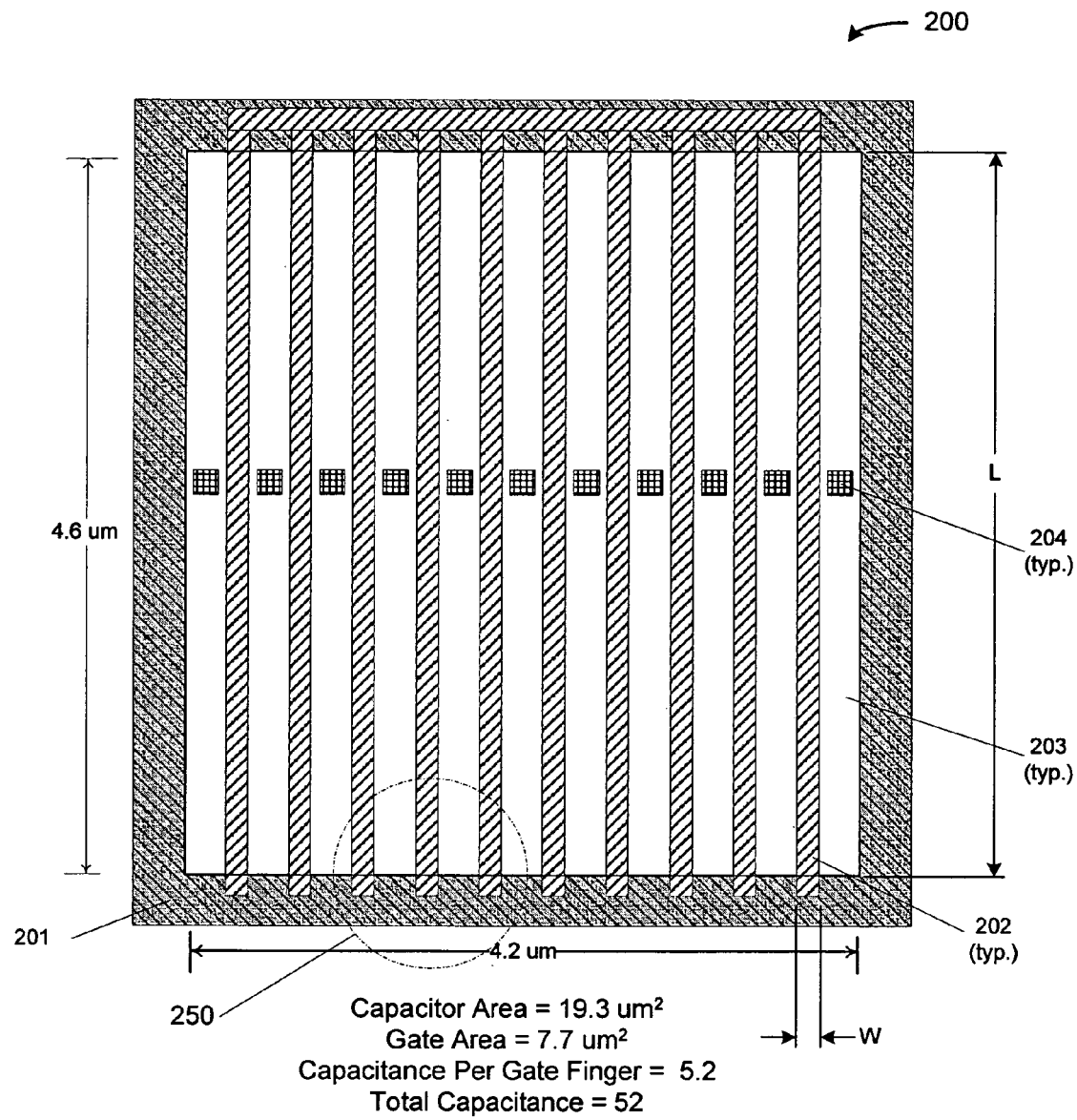
FIG. 6A illustrates a top view of the physical layout of an MOS capacitor in one embodiment of the present invention.
Figure 6B:
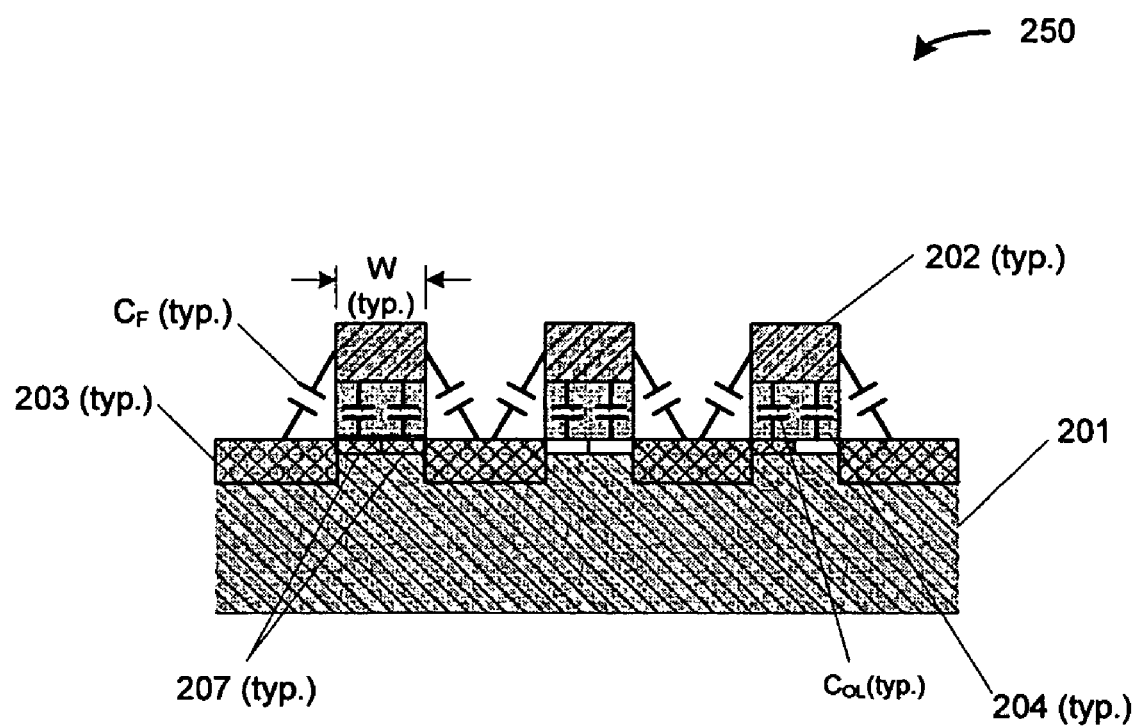
FIG. 6B illustrates a cross-sectional view of a section of the MOS capacitor of FIG. 6A in one embodiment of the present invention.

FIGS. 6A and 6B illustrates an N-type MOS (NMOS) capacitor structure 200 in one embodiment of the invention, although embodiments of the invention are not so limited and may include P-type MOS (PMOS) structures as are known in the art. In FIG. 6A, NMOS capacitor 200 is fabricated on a P-type substrate 201. The gate structure of MOS capacitor 200 includes a plurality of gate fingers 202 of width W and length L over an insulating oxide layer 204 (illustrated in FIG. 6B). Gate fingers 202 may be fabricated, for example, from polysilicon or a metallic conductor such as gold, silver, copper, aluminum or a combination thereof. The insulating oxide layer 204 may be fabricated, for example, from silicon dioxide, silicon nitride or silicon oxynitride. On each side of each gate finger 202 is an N+ drain/source diffusion 203 that may run the entire length L of the gate fingers 202. Each drain/source diffusion 203 may have a metalized contact 204, which may be interconnected with metallization as is known in the art (not shown). While FIG. 6A illustrates an example of 10 gate fingers, embodiments of the invention are not so limited and may have fewer or greater than 10 gate fingers. In one embodiment, the physical width W of each gate finger 201 may be approximately the minimum feature size that the fabrication process (e.g., CMOS photolithography) can produce, typically referred to as λ. In the exemplary structure illustrated in FIG. 6A, λ is equal to 0.16 microns, although embodiments of the invention are not so limited. In other embodiments, as described below, the width W of each gate finger may be less than or equal to approximately 2Δ (i.e., less than or equal to approximately twice the length of an ion-implanted tip 107).

FIG. 6B is a cross-sectional view of the circled area 250 in FIG. 6A. As illustrated in FIG. 6B, the source/drain diffusions 203 on each side of each gate finger 202 permits ion-implanted tips 207 to be made under each gate finger. As noted above, the width W of each gate finger may be less than or equal to approximately 2Δ. As such, the tips 207 underlapping each gate finger 202 will short out the channel region between each pair of drain source diffusions 203. As a result, a parallel plate capacitor is formed under each gate with a value on the order of $2C_{OL}$. In addition, fringing capacitance will increase compared to the continuous gate structure of FIG. 5A because each gate finger 202 has a fringing capacitance of approximately $2C_F$, which is equal to the total fringing capacitance of the conventional gate structure of FIG. 5A. Therefore, total fringing capacitance of an MOS capacitor in one embodiment of the invention will equal $2nC_F$, where n is the number of gate fingers.

For the exemplary structure illustrated in FIG. 6A, the total physical area of the capacitor is approximately 7.7 square microns. However, the capacitance per gate finger is approximately 5.2 normalized capacitance units. With 10 gate fingers, the total capacitance is approximately 52 normalized capacitance units. Therefore, the capacitance per unit area (physical area) has increased from 0.83 (=6.2/7.5) to approximately 2.7 (=52/19.3). If the conventional capacitor 101 in FIG. 5A is replaced with the exemplary MOS capacitor 200, then the coupling coefficient of the resulting floating gate memory device is increased from 0.86 to approximately 0.98 (=52/53).

Figure 7A:
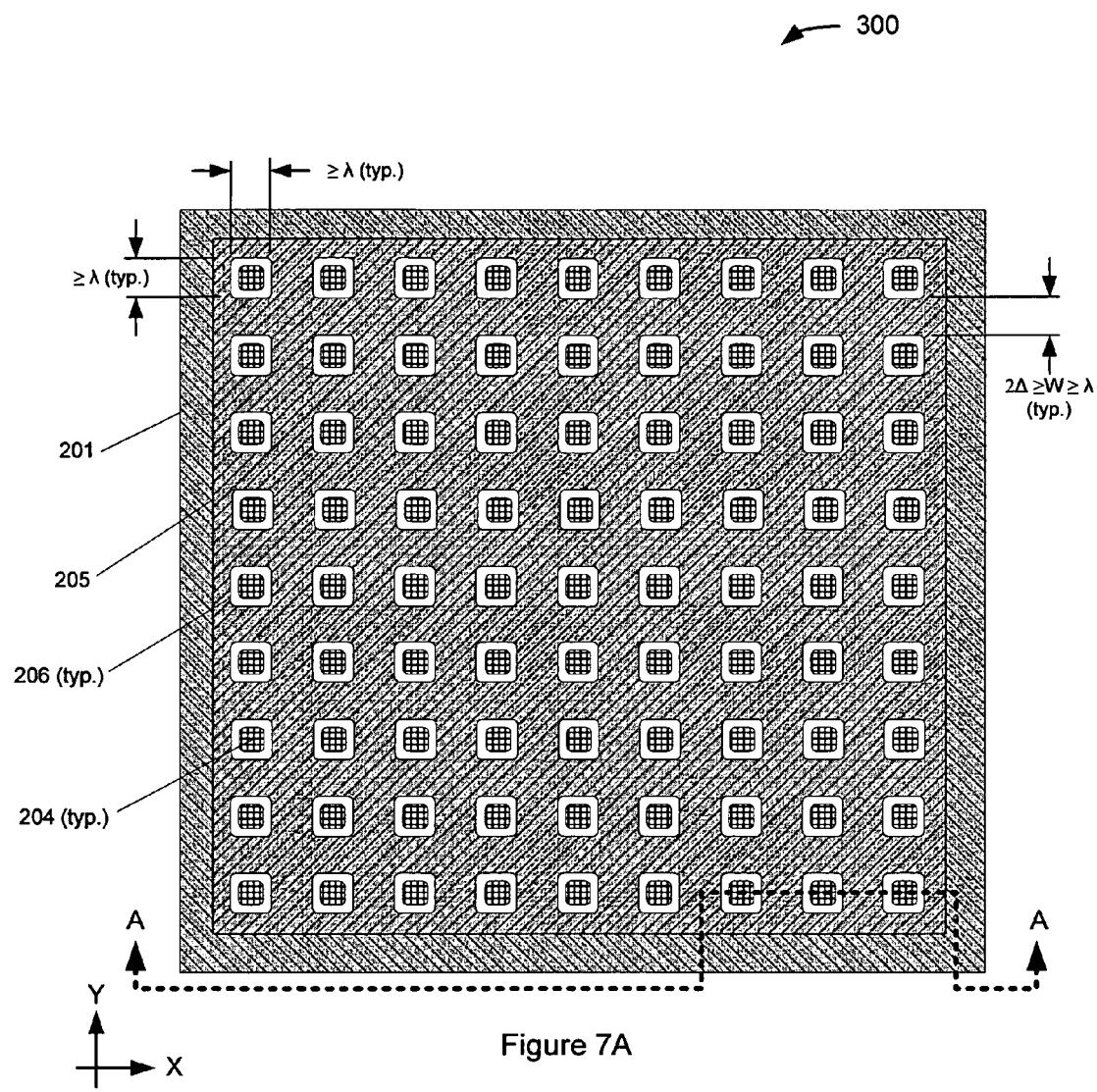
FIG. 7A illustrates a top view of the physical layout of an MOS capacitor in another embodiment of the present invention.
Figure 7B:
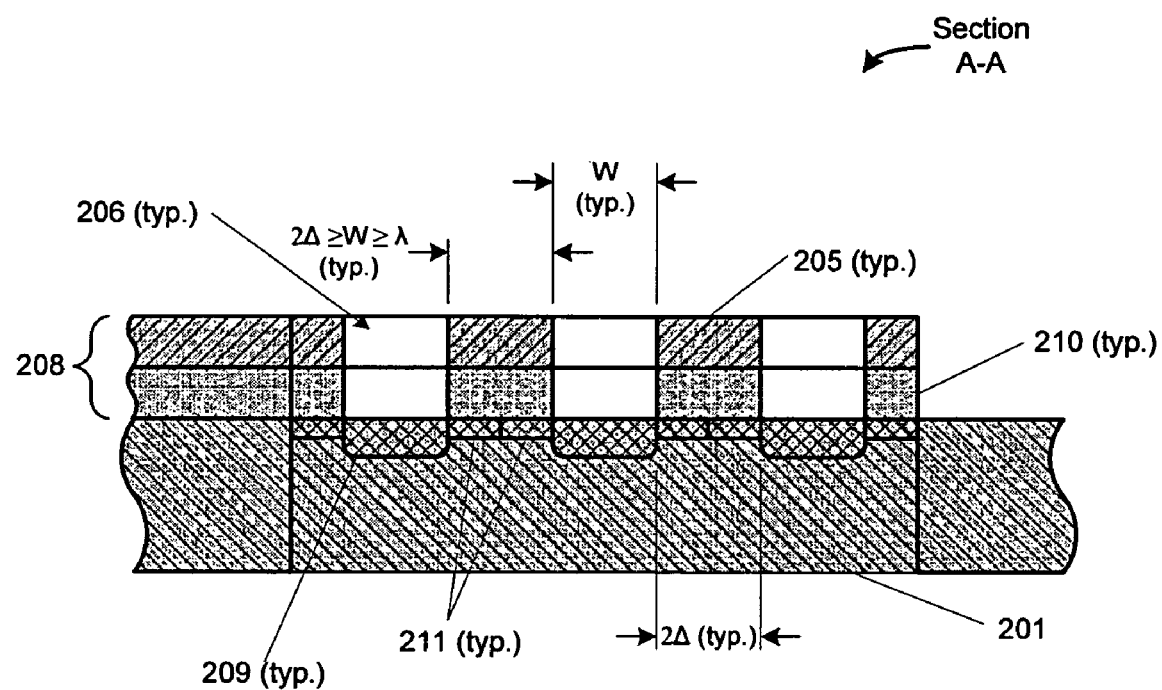
FIG. 7B illustrates a cross-sectional view of a section of the MOS capacitor of FIG. 7A in one embodiment of the present invention.
Figure 7C:
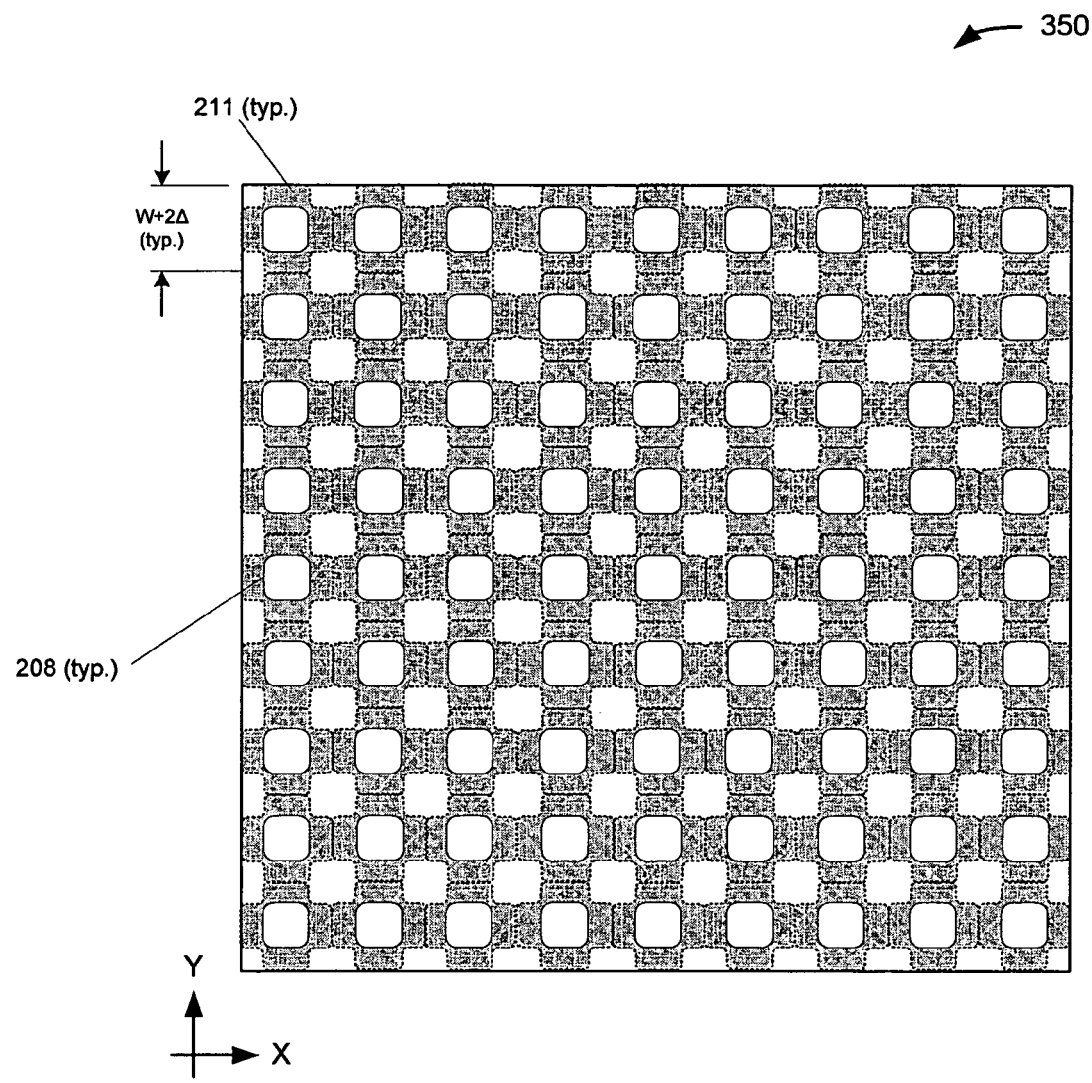
FIG. 7C illustrates a footprint of a plate of a parallel plate capacitor in one embodiment of the present invention.

The gate fingers 202 in MOS capacitor 200 each have an aspect ratio of L/W, which in the exemplary embodiment of FIG. 6A is approximately 29:1. In some applications, the inductance associated with such an aspect ratio may limit the response time of the floating gate memory device. FIGS. 7A and 7B (showing section A-A of FIG. 7A) illustrate an alternative embodiment of an MOS capacitor employing a "mesh" gate structure 208 with reduced inductance. In one embodiment, mesh gate structure 208 may include an insulating oxide layer 210 disposed upon semiconductor substrate 201 and a conductive layer 205 disposed upon insulating layer 210. Insulating layer 210 and conductive layer 205 may have a plurality of diffusion openings 206 arranged as an array of rows and columns. The diffusion openings may have linear dimensions greater than or equal to approximately λ and separations between adjacent diffusion openings may be greater than or equal to approximately λ and less than or equal to approximately 2Δ. In one embodiment, diffusions 209 may be made into each diffusion opening 208, followed by directional ion implantations in both the X and Y dimensions to form tips 211 in both the X and Y dimensions to form a continuous conductive layer under insulating oxide 210 that forms a parallel plate capacitor with gate 205. FIG. 7C illustrates a footprint 350 of the combined area of the diffusions 206 and the ion-implanted tip 209, which together with the gate 205 form one plate of a parallel plate capacitor. This footprint has a capacitance fill factor of approximately 52%. The fill factor is defined as the area of the parallel plate capacitor divided by the area of the MOS capacitor. By way of comparison, the fill factor of the exemplary MOS capacitor 200 is approximately 40% while the fill factor of the conventional MOS capacitor 101 is less than approximately 5%.

Figure 8:
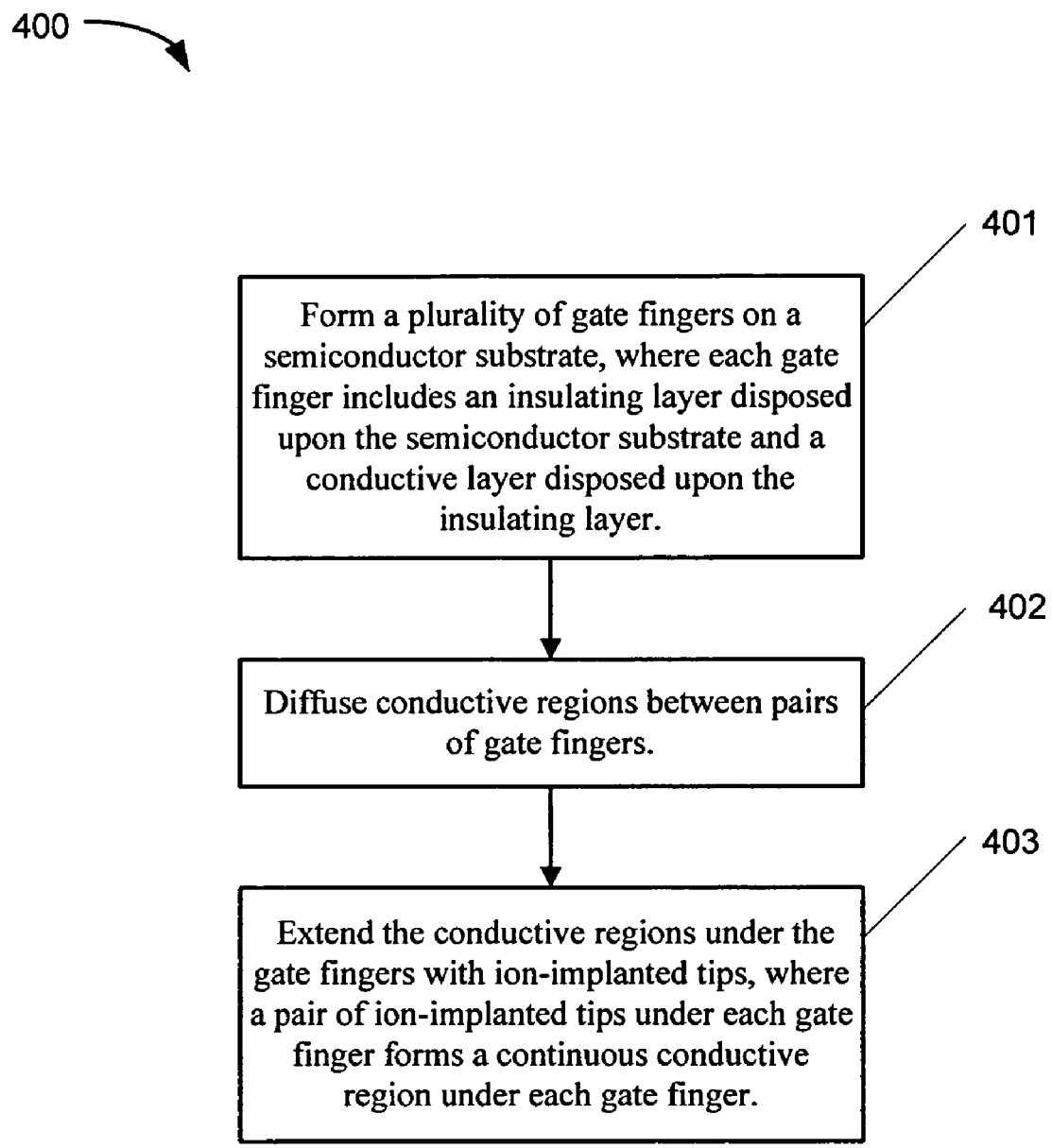
FIG. 8 is a flowchart illustrating a method for fabricating an MOS capacitor according to one embodiment of the present invention.

FIG. 8 is a flowchart 400 illustrating a method for fabricating an MOS capacitor according to one embodiment of the present invention. In FIG. 8, the method begins by forming a plurality of gate fingers on a semiconductor substrate, where each gate finger comprises an insulating layer disposed upon the semiconductor substrate and a conductive layer disposed upon the insulating layer (operation 401). The method continues by diffusing conductive regions between pairs of gate fingers (operation 402) and extending the conductive regions under the gate fingers with ion-implanted tips (operation 403), where a pair of ion-implanted tips under each gate finger forms a continuous conductive region under each gate finger.

Figure 9:
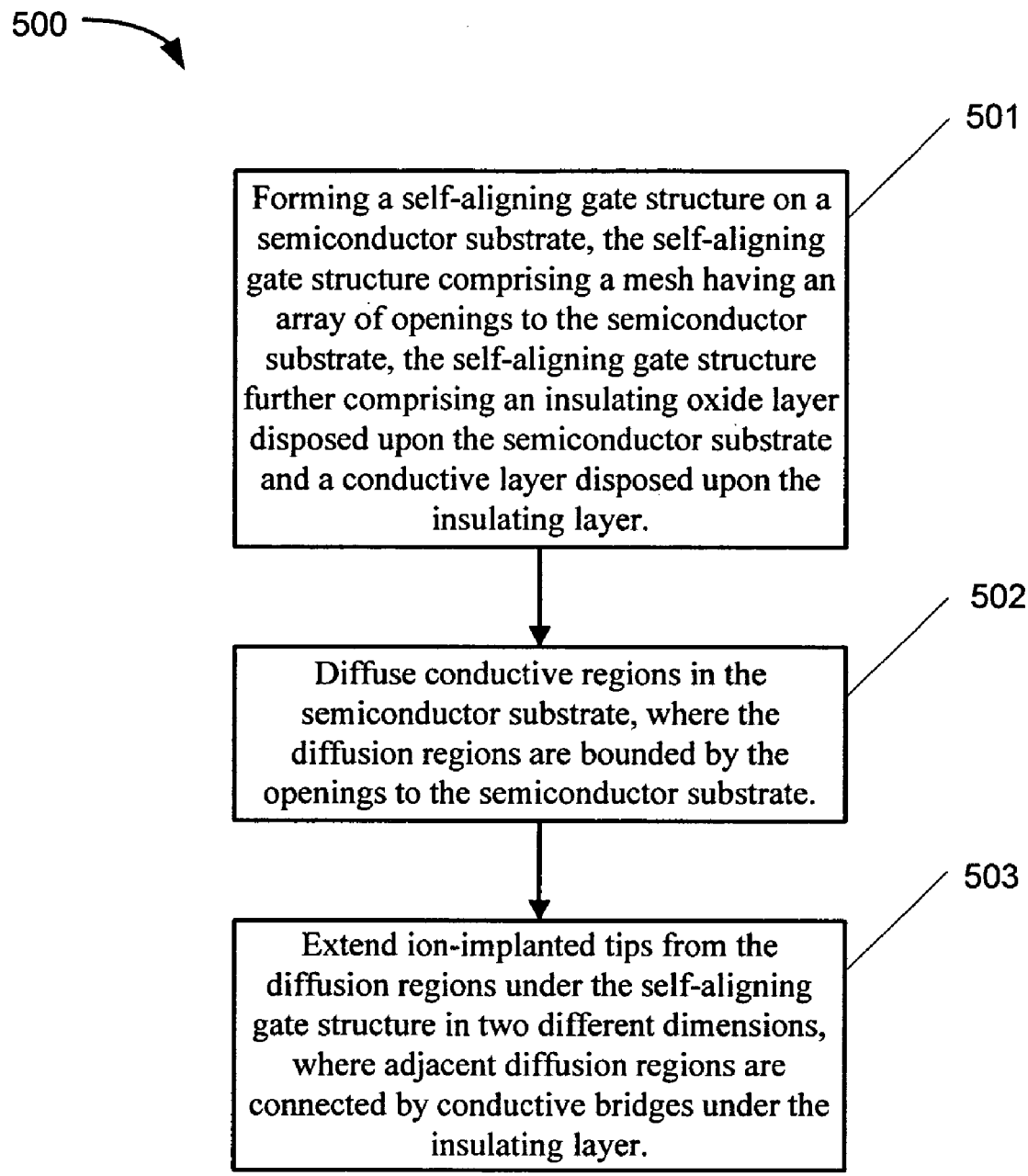
FIG. 9 is a flowchart illustrating another method for fabricating an MOS capacitor according to one embodiment of the present invention.

FIG. 9 is a flowchart 500 illustrating a method for fabricating an MOS capacitor according to another embodiment of the present invention. In FIG. 9, the method begins by a forming a self-aligning gate structure on a semiconductor substrate, where the self-aligning gate structure comprising a mesh having an array of openings to the semiconductor substrate, the self-aligning gate structure further comprising an insulating layer disposed upon the semiconductor substrate and a conductive layer disposed upon the insulating layer (operation 501). The method continues by diffusing conductive regions in the semiconductor substrate, where the diffusion regions are bounded by the openings to the semiconductor substrate (operation 502) and extending ion-implanted tips of the diffusion regions under the self-aligning gate structure in two different dimensions (operation 503), where adjacent diffusion regions are connected by conductive bridges under the insulating layer.

Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A device comprising an MOS capacitor including a gate structure disposed upon an insulating layer on a substrate, the gate structure comprising a contiguous conductive layer patterned to form a plurality of gate fingers, each gate finger electrically connected to each other through the conductive layer and comprising a length L and a width W less than length L, and a plurality of source/drain diffusions formed in the substrate on each side of the plurality of gate fingers and extending substantially the entire length L of each gate finger, the plurality of source/drain diffusions are separated from each other by channel regions underlying each of the plurality of gate fingers, wherein the gate structure and the plurality of source/drain diffusions capacitively couple along the length of each of the plurality of gate fingers and a sum of a capacitance formed between the plurality of gate fingers and the source/drain diffusions formed on either side thereof is greater than a sum of a capacitance formed between a continuous conductive region under each gate finger and the overlying gate finger.

2. The device of claim 1, further comprising ion-implanted tips extending each of the plurality of source/drain diffusions under adjacent gate fingers.

3. The device of claim 2, wherein the ion-implanted tips extend substantially the entire length L of each gate finger.

4. The device of claim 3, wherein the ion-implanted tips on each side of each gate finger form the continuous conductive region under the gate finger.

5. The device of claim 4, wherein the ion-implanted tips and each of the overlying gate fingers are configured to capacitively couple through the insulating layer.

6. The device of claim 1, wherein the width of each gate finger is substantially uniform along the length thereof.

7. The device of claim 1, further comprising an MOS tunnel diode coupled with the gate structure to form a floating gate memory device.

8. The device of claim 1, wherein the gate finger structure substantially does not include an insulator formed on sidewalls of the plurality of gate fingers.

9. A method comprising:
patterning a conductive layer on an insulating layer disposed upon a substrate to form a gate structure comprising a plurality of gate fingers electrically connected to each other through the conductive layer, each gate finger comprising a length L and a width W less than length L; and forming a plurality of source/drain diffusions in the substrate on each side of the plurality of gate fingers and extending substantially the entire length L of each gate finger, wherein the plurality of source/drain diffusions are separated from each other by channel regions underlying each of the plurality of gate fingers, wherein the length L and width W or each gate finger are configured so that a sum of a capacitance formed between the plurality of gate fingers and the source/drain diffusions formed on either side thereof is greater than a sum of a capacitance formed between a continuous conductive region under each gate finger and the overlying gate finger.

10. The method of claim 9, further comprising forming ion-implanted tips extending each of the plurality of source/drain diffusions under adjacent gate fingers, wherein a pair of ion-implanted tips under each gate finger comprises a continuous conductive region under the gate finger.

11. The method of claim 10, wherein the ion-implanted tips extend substantially the entire length L of each gate finger.

12. The method of claim 11, wherein the ion-implanted tips on each side of each gate finger form a continuous conductive region under the gate finger.

13. The method of claim 9, further comprising forming a plurality of contacts to the plurality of source/drain diffusions including forming at least one contact to each source/drain diffusion between each of the plurality of gate fingers.

14. The method of claim 9, wherein the width of each gate finger is substantially uniform along the length thereof.

15. The method of claim 9, further comprising coupling the plurality of gate fingers to a tunnel diode to form a floating gate memory device.

16. The method of claim 9, further comprising coupling the plurality of gate fingers to a tunnel diode to form a floating gate memory device.

17. A MOS capacitor comprising:
a gate structure disposed upon an insulating layer on a substrate, the gate structure comprising a contiguous conductive layer patterned to form a plurality of gate fingers, each gate finger comprising a length L and wherein each gate finger comprises a width W less than length L, wherein the plurality of gate fingers are parallel to each other along the lengths thereof;
a plurality of source/drain diffusions formed in the substrate on each side of the plurality of gate fingers and extending substantially the entire length L of each gate finger, wherein the plurality of source/drain diffusions are separated from each other by channel regions underlying each of the plurality of gate fingers; and
a plurality of contacts to the plurality of source/drain diffusions including at least one contact to each source/drain diffusion located between each of the plurality of gate fingers,
wherein the gate structure and the plurality of source/drain diffusions capacitively couple along the length of each of the plurality of gate fingers and a sum of a capacitance formed between the plurality of gate fingers and the source/drain diffusions formed on either side thereof is greater than a sum of a capacitance formed between a continuous conductive region under each gate finger and the overlying gate finger.

18. The MOS capacitor of claim 17, wherein the gate finger structure substantially does not include an insulator formed on sidewalls of the plurality of gate fingers.

19. A floating gate memory device comprising the MOS capacitor of claim 17, and further comprising an MOS tunnel diode coupled with the gate structure.

* * * * *